United States Patent
Yamamoto, née Takahashi et al.

(10) Patent No.: US 6,618,933 B2
(45) Date of Patent: Sep. 16, 2003

(54) LIQUID THERMOSETTING INSULATING RESIN COMPOSITION AND METHOD FOR PERMANENTLY FILLING HOLES IN PRINTED CIRCUIT BOARD BY THE USE THEREOF

(75) Inventors: Rieko Yamamoto, née Takahashi, Niiza (JP); Kyoichi Yoda, Higashimatsuyama (JP)

(73) Assignee: Taiyo Ink Manufacturing Co., Ltd., Tokyo (JP)

(*) Notice: Subject to any disclaimer, the term of this patent is extended or adjusted under 35 U.S.C. 154(b) by 0 days.

(21) Appl. No.: 10/035,173

(22) Filed: Jan. 4, 2002

(65) Prior Publication Data

US 2002/0082349 A1 Jun. 27, 2002

Related U.S. Application Data

(63) Continuation-in-part of application No. PCT/JP00/04426, filed on Jul. 4, 2000, now abandoned.

(30) Foreign Application Priority Data

Jul. 6, 1999 (JP) .............................. 11-191877

(51) Int. Cl.[7] ................................. H05K 3/22
(52) U.S. Cl. ........................... 29/829; 29/830; 523/440; 523/466
(58) Field of Search ................. 523/440, 466; 29/829, 830

(56) References Cited

U.S. PATENT DOCUMENTS 5,360,837 A    11/1994   Honda et al.
5,476,884 A  * 12/1995   Kayaba ........................ 523/443
5,652,042 A  *  7/1997   Kawakita ..................... 428/209

FOREIGN PATENT DOCUMENTS

| | | |
|---|---|---|
| EP | 0384707 | 8/1990 |
| JP | 4-218523 | 8/1992 |
| JP | 4-275322 | 9/1992 |
| JP | 5-230284 | 9/1993 |
| JP | 7-176846 | 7/1995 |
| JP | 7-242799 | 9/1995 |
| JP | 10-12044 | 1/1998 |
| JP | 10012044 | 1/1998 |

* cited by examiner

Primary Examiner—Robert Dawson
Assistant Examiner—D. Aylward
(74) Attorney, Agent, or Firm—Rader, Fishman & Grauer PLLC

(57) ABSTRACT

A liquid thermosetting insulating resin composition and a method for permanently filling holes in a printed circuit board by the use of the composition are provided. The liquid thermosetting insulating resin composition comprises (A) an epoxy resin assuming a liquid state at room temperature, preferably in combination with (B) a phenolic resin assuming a liquid state at room temperature, (C) a curing catalyst, and (D) a filler, wherein the filler (D) contains a spherical filler and a ground filler. Preferably the spherical filler includes a spherical fine filler and a spherical coarse filler. In a method for permanently filling holes in the printed circuit board, the composition is applied to the board so as to fill the holes in the printed circuit board and precured by application of heat. Thereafter, the parts of the precured composition protruding from a surface defining the holes is removed by polishing and then the precured composition is further heated to cause final curing thereof.

24 Claims, No Drawings

LIQUID THERMOSETTING INSULATING RESIN COMPOSITION AND METHOD FOR PERMANENTLY FILLING HOLES IN PRINTED CIRCUIT BOARD BY THE USE THEREOF

CROSS-REFERENCE TO RELATED APPLICATIONS

This is a continuation-in-part of Application PCT/JP00/04426, filed Jul. 4, 2000, now abandoned.

BACKGROUND OF THE INVENTION

1. Field of the Invention

This invention relates to a liquid thermosetting insulating resin composition which is particularly useful for permanently filling such holes as via holes and through holes in such printed circuit boards as a multilayer board and a double-sided board. This invention further relates to a method for permanently filling such holes as via holes and through holes in printed circuit boards by the use of the composition mentioned above.

2. Description of the Prior Art

As a composition for permanently filling such holes in printed circuit boards, epoxy resin compositions of the thermosetting type and the UV/heat-curable type have been heretofore used. Such epoxy resin compositions have been finding utility in a wide variety of fields covering electrical insulating materials, FRP (fiber-reinforced plastics) and other similar composite materials, coating materials, and adhesive agents because their hardened products excel in mechanical, electrical, and chemical properties, and exhibit good adhesiveness as well.

The thermosetting type epoxy resin composition uses a primary or secondary aromatic amine or acid anhydride as a curing agent and a tertiary amine or imidazole as a catalyst and its hardened product can be obtained by heating it.

When an aromatic amine is used, however, the resin composition shrinks largely during the course of thermal curing and the hardened filler eventually formed of the resin composition in a through hole gives birth to a gap between itself and the wall of the through hole or gives rise to voids (empty cavities) in the hardened filler filling the hole. When the thermosetting type epoxy resin composition employs other curing systems, it suffers from the curing reaction thereof and terminates instantaneously on account of a chain reaction, such that it is difficult to control. The resultant hardened filler has a high hardness such that it may not be easily polished or cut to a flat surface.

In the case of the thermosetting type epoxy resin composition containing a solvent, since the solvent vaporizes while the resin composition is being thermally cured, the hardened filler formed of the resin composition in the through hole has the problem of caving in or cissing and voids. The similar problem will arise in the UV/heat-curable type epoxy resin composition so long as it contains a solvent.

On the contrary, an attempt to decrease the content of the diluting solvent in the composition for permanently filling the holes for the purpose of suppressing the occurrence of voids or the like due to the vaporization of the solvent in the composition or further to incorporate a filler into the composition in a higher amount for the purpose of suppressing the voluminal expansion of the hardened product is made. According to such a method, although the thermal expansion of the resin can be suppressed owing to the incorporation of the filler into the composition in a higher amount, it has another problem of decrease in its property of filling in the through holes etc. due to the change in viscosity or thixotropy of the composition.

On the other hand, the UV/heat-curable type epoxy resin composition is hardened through the precure of the composition by the radical polymerization reaction of the double bond of a relevant photosensitive compound and subsequently the thermal curing of the epoxy resin during the course of heating to obtain a hardened product thereof. In the precuring step thereof by being exposed to an ultraviolet light, however, since the radical polymerization of the double bond of the photosensitive compound included in the composition such as, for example, acrylate proceeds more quickly in the surface part than in the inner part of the composition, the degree with which the composition is photocured varies in the surface part and the inner part thereof and the shrinkage which the composition sustains during the course of thermal post-curing tends to be large. Further, the resultant hardened product possesses high hygroscopicity and suffers from the drawback of failing to acquire electrical insulation properties and PCT (pressure cooker treatment) resistance sufficiently.

As respects the curing system which combines an epoxy resin with a phenolic resin, though having no bearing on a composition intended for permanently filling holes in printed circuit boards, published Japanese Patent Application, KOKAI (Early Publication) No. 8-157,561 discloses a semiconductor sealing epoxy resin composition characterized by containing a solid epoxy resin of a specific structure including at least one hydrocarbon group in a benzene ring in combination with an imidazole compound of a specific structure. This published specification discloses a composition example using a solid epoxy resin and a solid phenolic resin. The sealing resin which is obtained from this composition exhibits satisfactory characteristics and physical properties after it has been hardened, which will satisfy the properties required for the composition to be used for filling holes. The composition nevertheless is deficient in the ability to be coated as by screen printing or roll coating (the ability to fill the holes) because the epoxy resin and the phenolic resin which are raw materials are both in a powdery state. Further, since this composition is formulated to be in a liquid state by using a diluting agent such as a solvent, the possibilities of a voluminal decrease thereof due to the vaporization of the diluting agent and an adverse effect of the diluting agent on the natural environment are considered. This composition, therefore, has not yet found actual adoption as a filling material for through holes etc. in printed circuit boards due to its poor workability and printability.

SUMMARY OF THE INVENTION

The primary object of the present invention, therefore, is to provide a liquid thermosetting insulating resin composition which can establish incorporation of a filler therein in a high amount without impairing its ability to fill the holes (the ability to plug the holes) such as through holes and which shrinks only sparingly during the course of thermal curing and ultimately forms a hardened product excelling in thermal stability, resistance to heat and resistance to humidity, producing virtually no voluminal expansion even under the conditions of high temperature and high humidity, and excelling in PCT resistance.

A further object of the present invention is to provide a liquid thermosetting insulating resin composition which allows easy filling of holes in printed circuit boards by the conventional technique such as, for example, the screen printing process or roll coating process, enables the reaction thereof proceeding during the course of thermal curing to be arbitrarily controlled, can be precured and forms after the precure a hardened filler capable of being easily deprived of an unnecessary part by physical polishing, and proves particularly suitable as a composition for permanently filling holes in printed circuit boards.

Another object of the present invention is to provide a method for permanently filling holes in a printed circuit board, which method enables the holes in the printed circuit board to be filled with high operational and productional efficiency and produces in the holes hardened fillers excellent in both characteristics and physical properties.

To accomplish the objects mentioned above, the present invention provides a liquid thermosetting insulating resin composition for filling a via hole and/or a through hole in a printed circuit board. One embodiment of the composition is characterized by comprising (A) an epoxy resin which is in a liquid state at room temperature, (B) a phenolic resin which is in a liquid state at room temperature, (C) a curing catalyst, and (D) a filler, wherein the filler (D) contains a spherical filler and a ground filler. Another embodiment of the composition is characterized by comprising (A) an epoxy resin which is in a liquid state at room temperature, preferably at least two kinds of epoxy resins having different reactivity, (C) a curing catalyst, and (D) a filler, wherein the filler (D) contains a spherical filler and a ground filler.

Preferably the spherical filler mentioned above has an average particle diameter of not less than 0.1 μm and less than 25 μm and the ground filler mentioned above has an average particle diameter of not more than 25 μm.

In a preferred embodiment, the spherical filler mentioned above includes a spherical fine filler and a spherical coarse filler. In this case, preferably the spherical fine filler has an average particle diameter of not less than 0.1 μm and less than 3 μm and the spherical coarse filler has an average particle diameter of not less than 3 μm and less than 25 μm. Preferably the compounding ratio of the epoxy resin (A) and the phenolic resin (B) is such that the epoxy group of the epoxy resin (A) accounts for a proportion in the range of 0.8 to 3.0 equivalent weights per one equivalent weight of the phenolic hydroxyl group of the phenolic resin (B).

The expression "liquid at room temperature" as used in this specification is synonymous with "liquid at the temperature existing at the time of working" and the expression "room temperature" refers to the room temperature during the working time (when preparing the composition or using it) which is generally in the range of about 0° C. to about 30° C.

Further, the present invention provides a method for permanently filling a hole in a printed circuit board, which is characterized by comprising the steps of filling the hole in the printed circuit board with such a liquid thermosetting insulating resin composition as mentioned above, heating the composition filling the hole thereby effecting precure of the composition, polishing and removing the part of the precured composition which protrudes from the surface terminating the hole, and further heating the precured composition till final curing.

Since the liquid thermosetting insulating resin composition of the present invention contains a spherical filler in combination with a ground filler, particularly a spherical fine filler, a spherical coarse filler and a ground filler in combination, it is possible to incorporate fillers therein in a high amount with preventing a decrease in the ability to fill the holes due to the change in viscosity and thixotropy.

Further, since the composition uses the epoxy resin which is in a liquid state at room temperature or further the phenolic resin which is also in a liquid state at room temperature, it is possible to liquefy the composition either without using a diluting solvent capable of inducing voluminal shrinkage of the composition after the step of heating or using the solvent in an extremely small proportion. Accordingly, it is possible to fill holes such as, for example, via holes in a printed circuit board with the composition by the known and commonly utilized technique such as, for example, the screen printing process or roll coating process with high operational efficiency. Moreover, since the present invention utilizes the thermally curing reaction of the epoxy resin and the phenolic resin or the thermally curing reaction of at least two kinds of epoxy resins having different reactivity, the composition allows the two-stage curing of itself to be attained by application of heat and, after the precure, enables the unnecessary part of the precured composition which is in a relatively soft state to be very easily polished and removed by physical polishing. Owing to the combination of the aforementioned fillers and the curing reaction system, the composition shrinks only slightly during the course of final curing and allows ultimate formation of a hardened product which enjoys low hygroscopicity and excellent fastness of adhesion, possesses a small linear expansion coefficient, shows lower water absorption and smaller voluminal expansion under the conditions of high temperature and high humidity, and excels in PCT resistance.

By using the composition of the present invention, therefore, it is made possible to fill such holes as via holes and through holes in printed circuit boards with high operational efficiency and produce printed circuit boards of highly reliable performance with high productivity.

DETAILED DESCRIPTION OF THE INVENTION

The first feature of the liquid thermosetting insulating resin composition of the present invention consists in containing a spherical filler in combination with a ground filler as a filler (D), particularly a spherical fine filler, a spherical coarse filler and a ground filler in combination. Owing thereto, it is possible to incorporate fillers in the composition in a high amount without impairing the ability to fill the through holes etc. (the ability to plug the holes).

Next, the second feature of the composition of the present invention consists in using the epoxy resin which is in a liquid state at room temperature or the epoxy resin in combination with the phenolic resin which are both in a liquid state at room temperature. Accordingly, the inorganic filler which is required for the purpose of imparting low expansibility to the hardened product can be incorporated in the composition in a large amount, namely at a ratio of not less than 40% by weight based on the total weight of the composition, either without using a diluting solvent or using the solvent in an extremely small proportion. As a result, the shrinkage which is caused by the influence of the vaporization of the volatile component during the course of thermal curing can be repressed. Further, since the composition uses the epoxy resin and the phenolic resin which are both in a liquid state at room temperature, it assumes the ability to liquefy either without using a diluting agent or using the diluting agent in an extremely small proportion and enables holes such as, for example, via holes in a printed circuit board to be filled by the known and commonly utilized technique such as, for example, the screen printing process or roll coating process.

The third feature of the liquid thermosetting insulating resin composition of the present invention consists in utilizing the thermally curing reaction of the epoxy resin and the phenolic resin or the thermally curing reaction of at least two kinds of epoxy resins having different reactivity. Since this reaction system utilizes the addition reaction of an epoxy group and a phenolic hydroxyl group or the curing reaction of the epoxy resins having different reactivity, even when this reaction is suspended while the action of curing is in process, this action can be resumed by application of heat and allowed to proceed till final curing (finishing curing or postcuring). Thus, the composition allows the two-stage curing of itself to be attained by application of heat and, after the precure, enables the unnecessary part of the precured product which is in a relatively soft state to be very easily polished and removed by physical polishing.

The present invention is particularly advantageous in the former reaction system because the precured product of the epoxy resin and the phenolic resin shrinks only slightly during the course of final curing as compared with the product which is obtained when the conventional UV/heat-curable type composition is precured by the radical polymerization of the double bond of the photosensitive compound included therein and the finally cured product excels in thermal stability, resistance to heat and resistance to humidity, possesses a small linear expansion coefficient, and shows lower water absorption and smaller voluminal expansion under the conditions of high temperature and high humidity.

Now, the constituent components of the liquid thermosetting insulating resin composition of the present invention will be described in detail below.

First, the epoxy resin (A) specified above can be any of the epoxy resins which fulfill the sole requirement that they be in a liquid state at room temperature. As concrete examples of the epoxy resin, epoxy resins of various species represented by the bisphenol A type, bisphenol F type, bisphenol S type, phenol novolak type, and cresol novolak type may be cited. The epoxy resins of these species may be used either singly or in the form of a combination of two or more members, depending on the requirement for improving the special qualities of a coating film to be obtained.

An epoxy resin which is in a solid state at room temperature may be used in combination with the aforementioned epoxy resin which is in the liquid state at room temperature in such a proportion as avoids impairing the effect of the present invention. The proportion of the epoxy resin assuming the solid state at room temperature is preferred to be not more than 20% by weight based on the total amount of the epoxy resins.

Next, the phenolic resin (B) specified above can be any of the phenolic resins which fulfill the sole requirement that they be in a liquid state at room temperature. As concrete examples of the phenolic resin, phenolic resins of various species represented by the bisphenol A type, bisphenol F type, novolak type, resol type, modified bisphenol A types such as, for example, allylated bisphenol A type, and the modified bisphenol F types such as, for example, the allylated bisphenol F type may be cited. The phenolic resins of these species may be used either singly or in the form of a combination of two or more members.

A phenolic resin which is in a solid state at room temperature may be used in combination with the aforementioned phenolic resin which is in the liquid state at room temperature in such a proportion as avoids impairing the effect of the present invention. The proportion of the phenolic resin assuming the solid state at room temperature is preferred to be not more than 20% by weight based on the total amount of the phenolic resins.

The compounding ratio of the epoxy resin (A) and the phenolic resin (B) is preferred to be such that the epoxy group of the epoxy resin (A) may account for a proportion in the range of 0.8 to 3.0 equivalent weights per one equivalent weight of the phenolic hydroxyl group of the phenolic resin (B). If the proportion is less than 0.8 equivalent weight, the shortage will make the resultant hardened product offer insufficient water resistance, acquire no sufficiently low hygroscopicity, betray deficiency in polishability and fastness of adhesion, and suffer an undue increase in the linear expansion coefficient. Conversely, if this proportion exceeds 3.0 equivalent weights, the excess will be at a disadvantage in strengthening the anionically polymerizing property of the epoxy resin through the medium of an imidazole catalyst and preventing the composition from acquiring the two-stage thermally curing property. More preferably, the compounding ratio is such that the proportion of the epoxy group may be in the range of 1.2 to 2.0 equivalent weights per one equivalent weight of the phenolic hydroxyl group.

The curing catalyst (C) specified above can be any of the curing catalysts which fulfill the requirement that they be effective in promoting the addition reaction of an epoxy group and a phenolic hydroxyl group. As concrete examples of the curing catalyst, imidazoles represented by commercial products sold under the codes of 2E4MZ, C11Z, C17Z, and 2PZ, azine compounds of imidazoles represented by commercial products sold under the codes of 2MZ-AZINE and 2E4MZ-AZINE, isocyanurates of imidazoles represented by commercial products sold under the codes of 2MZ-OK and 2PZ-OK, and imidazole hydroxymethyl compounds represented by commercial products sold under the codes of 2PHZ and 2P4MHZ (the aforementioned commercial products invariably made by Shikoku Kasei Kogyo Co., Ltd.), dicyandiamide and derivatives thereof, melamine and derivatives thereof, diaminomaleonitrile and derivatives thereof, amines such as diethylene triamine, triethylene tetramine, tetramethylene pentamine, bis(hexamethylene) triamine, triethanol amine, diaminodiphenyl methane, and organic acid hydrazides, 1,8-diazabicyclo[5.4.0]undecene-7 (made by Sun-Apro K.K. and sold under the product code of "DBU"), 3,9-bis(3-aminopropyl)-2,4,8,10-tetraoxaspiro [5.5]undecane (made by Ajinomoto Co., Inc. and sold under the product code of "ATU"), and organic phosphine compounds such as triphenyl phosphine, tricyclohexyl phosphine, tributyl phosphine, and methyl diphenyl phosphine may be cited. These curing catalysts may be used either singly or in the form of a combination of two or more members, depending on the requirement for improving the special qualities of a coating film to be aimed at. In the curing catalysts of this class, dicyandiamide, melamine, guanamine and derivatives thereof such as acetoguanamine, benzoguanamine, and 3,9-bis[2-(3,5-diamino-2,4,6-triazaphenyl)-ethyl]-2,4,8,10-tetraoxaspiro[5.5]undecane, and organic acid salts and epoxy adducts of these compounds are known to possess the ability to adhere fast to copper and the ability to rustproof copper and are capable of not only functioning as a curing agent for the epoxy resin but also contributing to the protection of the copper of a printed circuit board against discoloration and, therefore, are advantageously usable.

The amount of the curing catalyst (C) to be incorporated in the composition has only to suffice the standard quantitative proportion. It is proper, for example, to be not less than 0.1 part by weight and not more than 10 parts by weight, based on the total amount of the epoxy resin (A) and the phenolic resin (B) taken as 100 parts by weight.

As described above, the liquid thermosetting insulating resin composition of the present invention contains a spherical filler in combination with a ground filler as the fillers (D) for the purpose of enabling incorporation of fillers therein in a high amount without impairing the ability to fill the through holes etc. (the ability to plug the holes). In a preferred embodiment, the spherical filler includes a spherical fine filler and a spherical coarse filler.

Of these fillers, the spherical fine filler and the spherical coarse filler play the role in high filling of holes with the fillers and the ground filler acts to prevent a decrease in the ability to fill holes due to the change in viscosity and thixotropy of the composition. To exhibit such functions effectively, it is preferable that the spherical fine filler should have an average particle diameter of not less than 0.1 $\mu$m and less than 3 $\mu$m, more preferably in the range of 0.1–1.0 $\mu$m, the spherical coarse filler should have an average particle diameter of not less than 3 $\mu$m and less than 25 $\mu$m, more preferably in the range of 4–10 $\mu$m, and the ground filler should have an average particle diameter of not more than 25 $\mu$m, more preferably not more than 10 $\mu$m. Incidentally, it is preferable that the difference between the average particle diameter of the spherical fine filler and the average particle diameter of the spherical coarse filler should be in the range of 2–12 $\mu$m.

As the fillers (D) of such forms as specified above, any of the substances which are used as the standard fillers for resin may be used. As concrete examples thereof, extenders such as silica, precipitated barium sulfate, talc, calcium carbonate, silicon nitride, and aluminum nitride and metallic powders of copper, tin, zinc, nickel, silver, palladium, aluminum, iron, cobalt, gold, platinum, etc. may be cited.

These fillers are divided according to their shapes into two classes; the spherical filler and the ground filler having a shape other than a spherical shape. The spherical fillers are divided according to their average particle diameters into two classes; the spherical fine filler and the spherical coarse filler, as mentioned above. A spherical silica may be advantageously used as the spherical fine filler and as the spherical coarse filler. Among other fillers (inorganic ingredients) mentioned above, silica proves to be particularly excellent in low hygroscopicity and low voluminal expansibility. The silica may be fused silica, crystalline silica, or the mixture thereof.

Incidentally, the ground filler has a shape other than a spherical shape, such as needle-like, plate-like, scaly, hollow cylindrical, amorphous, hexagonal, cubic, or leaf-like shape.

It is preferable that the compounding ratio of the spherical fine filler to the spherical coarse filler should be 40–10:60–90, more preferably 30–20:70–80 by weight.

The amount of the ground filler to be incorporated in the composition is preferred to account for a proportion in the range of 5 to 20% by weight of the total weight of the fillers. If this proportion is less than 5% by weight, the flowability of the composition becomes too large. Conversely, if the proportion exceeds 20% by weight, the flowability of the composition becomes too poor. Either case will cause a decrease in the ability of the composition to fill the holes.

The amount of the mixture of fillers to be incorporated in the composition is preferred to account for a proportion in the range of 40 to 95% by weight of the total weight of the composition. If this proportion is less than 40% by weight, the shortage will prevent the hardened product from exhibiting sufficiently low expansibility and cause it to suffer from deficiency in polishability and fastness of adhesion. Conversely, if the proportion exceeds 95% by weight, the excess will allow no easy conversion of the composition into a liquid paste and prevent the composition from acquiring the printability or the ability to fill holes.

Though the composition of the present invention does not always require to use a diluting solvent because it uses the epoxy resin and the phenolic resin which are both in a liquid state, it may incorporate a diluting solvent for the purpose of adjusting the viscosity of itself. The proportion of the diluting solvent is preferred to be not more than 10% by weight based on the total weight of the composition. If it exceeds 10% by weight, the excess will cause an unduly large increase in the shrinkage of the composition under the influence of the vaporization of the diluting solvent during the course of heating. More preferably, the proportion is not more than 5% by weight. No incorporation of the diluting solvent proves to be most favorable.

Examples of the diluting solvents include, but are not limited to: ketones such as methyl ethyl ketone and cyclohexanone; aromatic hydrocarbons such as toluene, xylene, and tetramethyl benzene; glycol ethers such as methyl cellosolve, butyl cellosolve, methyl carbitol, butyl carbitol, propylene glycol monomethyl ether, dipropylene glycol monoethyl ether, and triethylene glycol monoethyl ether; esters such as ethyl acetate, butyl acetate, and acetates of glycol ethers mentioned above; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha.

The composition of the present invention, when necessary, may further incorporate therein any of known and commonly used coloring agents such as phthalocyanine blue, phthalocyanine green, iodine green, disazo yellow, crystal violet, titanium oxide, carbon black, and naphthalene black which are used in ordinary screen printing grade resist compositions, any of known and commonly used thermal polymerization inhibitors such as hydroquinone, hydroquinone monomethyl ether, tert-butyl catechol, pyrogallol, and phenothiazine which are used for imparting the stability needed during storage, any of known and commonly used thickening agent or thixotropic agent such as clay, kaolin, organobentonite, and montmorillonite, silicone type, fluorine type, or macromolecular type anti-foaming agent and/or leveling agent, adhesiveness imparting agent such as imidazole-based compound, thiazole-based compound, triazole-based compound, and silane coupling agent, or any other known and commonly used additives.

The liquid thermosetting insulating resin composition of the present invention which is obtained as described above can be made to fill such holes as via holes and through holes in printed circuit boards by the use of such a conventional technique as, for example, the screen printing process, curtain coating process, spray coating process, or roll coating process.

Subsequently, the composition presently filling the holes in the printed circuit boards is heated for the sake of precuring at a temperature in the approximate range of 90° to 130° C. for a period in the approximate range of 30 to 90 minutes. Since the resultant precured composition has relatively low hardness, the unnecessary parts thereof which protrude from the surfaces of the board can be easily removed along flat planes included in the surfaces by physical polishing.

Thereafter, the precured composition is again heated for the sake of final curing (postcuring or finish curing) at a temperature in the approximate range of 140° to 180° C. for a period in the approximate range of 30 to 90 minutes. During this step, since the hardened composition hardly expands or shrinks owing to the low expansibility of the liquid thermosetting insulating resin composition of the present invention, it ultimately forms a finished product which enjoys a satisfactory dimensional stability and excels in low hygroscopicity, fastness of adhesion, and electrical insulation properties. The resultant hardened product excels in thermal stability, resistance to heat and resistance to humidity, exhibits smaller voluminal expansion even under the conditions of high temperature and high humidity, and excels in PCT resistance. Incidentally, the hardness of the precured composition mentioned above can be controlled by varying the heating time and the heating temperature used for the precuring.

In accordance with the method for permanently filling holes in a printed circuit board by using the liquid thermosetting insulating resin composition of the present invention mentioned above, it is possible to fill the holes in the printed circuit board with the composition with high operational and productional efficiency and produce in the holes hardened fillers excellent in both characteristics and physical properties.

Now, the present invention will be described specifically below with reference to working examples and comparative examples. The word "parts" mentioned below refers invariably to "parts by weight" unless otherwise specified.

EXAMPLE 1

A thermosetting composition intended as a composition for permanently filling holes in a substrate was obtained by mixing preparatorily 35 parts of a mixture of a bisphenol A type epoxy resin and a bisphenol F type epoxy resin (sold under the trademark designation of "Epo Tohto" ZX-1059, epoxy equivalent weight=160; made by Tohto Kasei Co., Ltd.) as an epoxy resin which is in a liquid state at room temperature, 15 parts of a bisphenol A type resin (phenolic hydroxyl group equivalent weight=114) as a phenolic resin which is in a liquid state at room temperature, a mixed filler consisting of 50.0 parts of coarse spherical silica having an average particle diameter of 6.0 $\mu$m, 15.0 parts of fine spherical silica having an average particle diameter of 0.5 $\mu$m, and 10.0 parts of ground talc having an average particle diameter of 8 $\mu$m, 2.0 parts of a curing catalyst (sold under the trademark designation of "CUREZOL" 2PHZ and made by Shikoku Kasei Kogyo Co., Ltd.), and 2.0 parts of dipropylene glycol monomethyl ether (sold under the trademark designation of "DAWANOL" DPM and made by the Dow Chemical Company) and kneading the resultant mixture with a three-roll mill.

EXAMPLE 2

A thermosetting composition intended as a composition for permanently filling holes in a substrate was obtained by faithfully following the procedure of Example 1 except that a mixture consisting of 65 parts of coarse spherical silica having an average particle diameter of 6.0 $\mu$m and 10.0 parts of ground talc having an average particle diameter of 8 $\mu$m was used as a mixed filler.

EXAMPLE 3

A thermosetting composition intended as a composition for permanently filling holes in a substrate was obtained by faithfully following the procedure of Example 1 while using 37 parts of the mixture of a bisphenol A type epoxy resin and a bisphenol F type epoxy resin (sold under the trademark designation of "Epo Tohto" ZX-1059, epoxy equivalent weight=160; made by Tohto Kasei Co., Ltd.) as a liquid epoxy resin and 13 parts of a bisphenol F type resin (phenolic hydroxyl group equivalent weight=100) as a liquid phenolic resin.

EXAMPLE 4

A thermosetting composition intended as a composition for permanently filling holes in a substrate was obtained by faithfully following the procedure of Example 1 while using 37 parts of a bisphenol F type epoxy resin (epoxy equivalent weight=190) as a liquid epoxy resin and 13 parts of a bisphenol A type resin (phenolic hydroxyl group equivalent weight=114) as a liquid phenolic resin.

EXAMPLE 5

A thermosetting composition intended as a composition for permanently filling holes in a substrate was obtained by faithfully following the procedure of Example 1 while using 38 parts of a bisphenol F type epoxy resin (epoxy equivalent weight=190) as a liquid epoxy resin and 12 parts of a bisphenol F type resin (phenolic hydroxyl group equivalent weight=100) as a liquid phenolic resin.

EXAMPLE 6

A thermosetting composition intended as a composition for permanently filling holes in a substrate was obtained by mixing preparatorily 35 parts of the mixture of a bisphenol A type epoxy resin and a bisphenol F type epoxy resin (sold under the trademark designation of "Epo Tohto" ZX-1059, epoxy equivalent weight=160; made by Tohto Kasei Co., Ltd.) as an epoxy resin which is in a liquid state at room temperature, 15 parts of a bisphenol A type resin (phenolic hydroxyl group equivalent weight=114) as a phenolic resin which is in a liquid state at room temperature, a mixed filler consisting of 50.0 parts of coarse spherical silica having an average particle diameter of 6.0 $\mu$m, 15.0 parts of fine spherical silica having an average particle diameter of 0.5 $\mu$m, and 10.0 parts of ground talc having an average particle diameter of 8 $\mu$m, 2.6 parts of a curing catalyst (2.5 parts of product code "2PHZ" and 0.1 part of product code "2MZ-AZINE", both made by Shikoku Kasei Kogyo Co., Ltd.), 0.5 part of a coupling agent (silane coupling agent), and 2.0 parts of dipropylene glycol monomethyl ether (sold under the trademark designation of "DAWANOL" DPM and made by the Dow Chemical Company) and kneading the resultant mixture with a three-roll mill.

EXAMPLE 7

A thermosetting composition intended as a composition for permanently filling holes in a substrate was obtained by faithfully following the procedure of Example 6 except that 0.5 part of carbon black was further added into the mixture.

EXAMPLE 8

A thermosetting composition intended as a composition for permanently filling holes in a substrate was obtained by mixing preparatorily 50 parts of the mixture of a bisphenol A type epoxy resin and a bisphenol F type epoxy resin (sold under the trademark designation of "Epo Tohto" ZX-1059, epoxy equivalent weight=160; made by Tohto Kasei Co., Ltd.) as an epoxy resin which is in a liquid state at room temperature, a mixed filler consisting of 50 parts of coarse spherical silica having an average particle diameter of 6.0 $\mu$m, 15 parts of fine spherical silica having an average particle diameter of 1.5 μm, and 10 parts of ground calcium carbonate having an average particle diameter of 2 μm, 3.0 parts of a curing catalyst (sold under the trademark designation of "CUREZOL" 2MZ-AZINE and made by Shikoku Kasei Kogyo Co., Ltd.), 0.7 part of a coupling agent (titanate-based coupling agent), and 2.0 parts of organobentonite and kneading the resultant mixture with a three-roll mill.

COMPARATIVE EXAMPLE 1

A thermosetting composition intended as a composition for permanently filling holes in a substrate was obtained by faithfully following the procedure of Example 1 while omitting the incorporation of the ground talc as a ground filler.

COMPARATIVE EXAMPLE 2

A thermosetting composition intended as a composition for permanently filling holes in a substrate was obtained by faithfully following the procedure of Example 1 while omitting the incorporation of coarse spherical silica and fine spherical silica.

The compositions obtained in Examples and Comparative Examples mentioned above are shown collectively in Table 1 below.

The compositions obtained by the procedures of Examples and Comparative Examples mentioned above, each intended for permanently filling holes in a substrate, were subjected to the following tests to evaluate the ability to fill holes in a printed circuit board and the PCT resistance etc. of the filled and hardened products. The test results are shown in Table 2 below.

Viscosity:
0.2 ml of each of the compositions of Examples 1–8 and Comparative Examples 1 and 2 intended for permanently filling holes was collected and subjected to the measurement with an E-type viscometer (manufactured by Toki Sangyo K.K.) under the conditions of 25° C. and the number of revolutions 5 rpm/min.

Filling Property:
On glass-epoxy resin substrates having plated through holes formed in advance therein by panel plating, the compositions of Examples 1–8 and Comparative Examples 1 and 2 intended for permanently filling holes were applied by the screen printing method to fill the through holes under the following printing conditions. The resultant substrates were then placed in a hot air circulating drying oven and heated therein at 120° C. for one hour by way of precuring to obtain test samples. The filling property was rated by the degree of filling of the hardened composition in the through holes of the test sample on the following three-point scale.
○: Completely filled
X1: The filled composition flowed out of the bottom part to the periphery.
X2: The composition was not filled up to the bottom part (insufficient filling)
<Printing Conditions>
　Squeegee: thickness of squeegee of 20 mm, hardness of 70°,
　　oblique polishing: 23°,
　Printing plate: PET 100 mesh bias print,
　Printing pressure: 60 kgf/cm$^2$,
　Speed of squeegee: 5 cm/sec.
　Angle of squeegee: 80°

Polishability:
On glass-epoxy resin substrates having plated through holes formed in advance therein by panel plating, the compositions of Examples 1–8 and Comparative Examples 1 and 2 intended for permanently filling holes were applied by the screen printing method to fill the through holes. The resultant substrates were then placed in a hot air circulating drying oven and heated therein at 120° C. for one hour by way of precuring to obtain test samples (I). The test samples (I) were physically polished with a buffing device to rate the ease with which the unnecessary parts of the precured products were removed on the following three-point scale.
○: Polishable with ease
Δ: Polishable with certain difficulty
X: Not polishable Shrinkability:
The test samples (I) were physically polished with a buffing device to remove unnecessary parts of the precured products filling the holes along the planes included in the surfaces of the substrates. The samples thus polished were placed in a hot air circulating drying oven and heated therein at 150° C. for one hour by way of final curing to obtain test samples (II) and rate the ratio of shrinkage by the final curing on the following three-point scale.
○: No shrinkage by curing
Δ: Only slight change observed
X: Conspicuous shrinkage observed Fastness of Adhesion:
The test samples (II) mentioned above were rated for fastness of adhesion thereof to the walls of copper-plated through holes on the following three-point scale.
○: Absolutely no separation observed
Δ: Only slight separation observed
X: Separation clearly observed Water Absorption:
The compositions of Examples 1–8 and Comparative Examples 1 and 2 intended for permanently filling holes were applied by the screen printing method to glass sheets of known weights. The glass sheets covered with the compositions were heated in a hot air circulating drying oven at 120° C. for one hour by way of precuring, left cooling, and heated at 150° C. for one hour by way of final curing to obtain test samples (III). The test samples (III) were cooled to room temperature and then weighed. Subsequently, the test samples (III) were treated in a pressure cooker under the conditions of 121° C., 100% R.H., and the treating time of 24 hours and weighed to find the weights of the hardened products. The water absorption of the hardened products were calculated by the following equation:

$$\text{Water absorption}(\%) = \{(W_2 - W_1)/(W_1 - W_g)\} \times 100$$

where $W_1$ is the weight of the test sample (III), $W_2$ is the weight of the test sample (III) after the PCT (pressure cooker treatment), and $W_g$ is the weight of the glass sheet used.

Voluminal Expansion:
The test samples (II) mentioned above were treated in a pressure cooker under the conditions of 121° C., 100% R.H., and the treating time of 96 hours to rate the ratios of expansion caused on the hardened products by the treatment on the following three-point scale.
○: No voluminal expansion
Δ: Only slight change observed
X: Conspicuous expansion observed Glass Transition Point (Tg):
The compositions of Examples 1–8 and Comparative Examples 1 and 2 intended for permanently filling holes were applied by the screen printing method to Teflon (a trademark of E.I. du Pont de Nemours & Co. for polytetrafluoroethylene) sheets washed with water and dried in advance. The sheets covered with the compositions were heated in a hot air circulating drying oven at 120° C. for one hour by way of precuring, left cooling, and heated at 150° C. for one hour by way of final curing. They were cooled to room temperature and the hardened films were separated from the Teflon sheets to obtain test samples (IV). The test samples (IV) were tested for glass transition point by the TMA method. Linear expansion coefficients ($\alpha_1$, $\alpha_2$):

The test samples (IV) were tested for linear expansion coefficient by the TMA method to determine the linear expansion coefficient $\alpha_1$ before the glass transition point and the linear expansion coefficient $\alpha_2$ after the glass transition point.

composition which used only a ground filler as a filler (Comparative Example 2) were poor in the filling property. Further, the hardened product obtained from the composition of Comparative Example 1 which used only a spherical filler was poor in the fastness of adhesion. On the other hand, the hardened product obtained from the composition of Comparative Example 2 which used only a ground filler showed a large shrinkage during the course of final curing and exhibited high water absorption and high linear expansion coefficient. Thus, it will be clear that this composition will betray deficiency in the PCT durability.

While certain specific working examples have been disclosed herein, the invention may be embodied in other specific forms without departing from the spirit or essential characteristics thereof. The described examples are therefore to be considered in all respects as illustrative and not

TABLE 1

| Components (parts by weight) | Examples | | | | | | | | Comparative Examples | |
|---|---|---|---|---|---|---|---|---|---|---|
| | 1 | 2 | 3 | 4 | 5 | 6 | 7 | 8 | 1 | 2 |
| Liquid epoxy resin (1) | 35.0 | 35.0 | 37.0 | — | — | 35.0 | 35.0 | 50.0 | 37.0 | 37.0 |
| Liquid epoxy resin (2) | — | — | — | 37.0 | 38.0 | — | — | — | — | — |
| Liquid phenol resin (1) | 15.0 | 15.0 | — | 13.0 | — | 15.0 | 15.0 | — | 13.0 | 13.0 |
| Liquid phenol resin (2) | — | — | 13.0 | — | 12.0 | — | — | — | — | — |
| Curing catalyst (1) | 2.0 | 2.0 | 2.0 | 2.0 | 2.0 | 2.5 | 2.5 | — | 2.0 | 2.0 |
| Curing catalyst (2) | — | — | — | — | — | 0.1 | 0.1 | 3.0 | — | — |
| Coarse spherical silica (average particle diameter 6.0 μm) | 50.0 | 65.0 | 50.0 | 50.0 | 50.0 | 50.0 | 50.0 | 50.0 | 60.0 | — |
| Fine spherical silica (average particle diameter 0.5 μm) | 15.0 | — | 15.0 | 15.0 | 15.0 | 15.0 | 15.0 | 15.0 | 15.0 | — |
| Ground talc | 10.0 | 10.0 | 10.0 | 10.0 | 10.0 | 10.0 | 10.0 | — | — | 75.0 |
| Ground calcium carbonate | — | — | — | — | — | — | — | 10.0 | — | — |
| Coupling agent | — | — | — | — | — | 0.5 | 0.5 | 0.7 | — | — |
| Carbon black | — | — | — | — | — | — | 0.5 | — | — | — |
| Organobentonite | — | — | — | — | — | — | — | 2.0 | — | — |

Remarks
Liquid epoxy resin (1): mixture of a bisphenol A type resin and a bisphenol F type resin (epoxy equivalent: 160 g/eq.)
Liquid epoxy resin (2): bisphenol F type resin (epoxy equivalent: 190 g/eq.)
Liquid phenol resin (1): bisphenol A type resin (phenolic hydroxyl group equivalent: 114 g/eq.)
Liquid phenol resin (2): bisphenol F type resin (phenolic hydroxyl group equivalent: 100 g/eq.)
Ground talc: average particle diameter 8 μm
Ground calcium carbonate: average particle diameter 2 μm

TABLE 2

| Properties | Examples | | | | | | | | Comparative Examples | |
|---|---|---|---|---|---|---|---|---|---|---|
| | 1 | 2 | 3 | 4 | 5 | 6 | 7 | 8 | 1 | 2 |
| Viscosity (ps) | 507 | 582 | 486 | 543 | 507 | 450 | 486 | 444 | 522 | 3810 |
| Filling property | ○ | ○ | ○ | ○ | ○ | ○ | ○ | ○ | X1 | X2 |
| Polishability | ○ | ○ | ○ | ○ | ○ | ○ | ○ | ○ | ○ | Δ |
| Shrinkability | ○ | ○ | ○ | ○ | ○ | ○ | ○ | ○ | Δ | Δ |
| Fastness of adhesion | ○ | ○ | ○ | ○ | ○ | ○ | ○ | ○ | Δ | Δ |
| Water absorption (%) | 0.45 | 0.45 | 0.45 | 0.50 | 0.50 | 0.45 | 0.47 | 0.90 | 0.50 | 1.00 |
| Tg (° C.) | 135 | 135 | 130 | 140 | 135 | 135 | 127 | 160 | 130 | 120 |
| Linear expansion coefficient ($\alpha_1 \times 10^{-6}$) | 25 | 30 | 25 | 25 | 25 | 25 | 25 | 35 | 25 | 50 |
| Linear expansion coefficient ($\alpha_2 \times 10^{-6}$) | 80 | 90 | 80 | 80 | 80 | 75 | 90 | 115 | 80 | 115 |

It is clearly noted from the results shown in Table 2 that the compositions of the Examples excelled in the ability to fill the holes and the polishability of the precured product and that the hardened products obtained therefrom had excellent properties such as shrinkability and fastness of adhesion.

On the contrary, both the composition which used only a spherical filler as a filler (Comparative Example 1) and the restrictive, the scope of the invention being indicated by the appended claims rather than by the foregoing description and all changes which come within the meaning and range of equivalency of the claims are, therefore, intended to be embraced therein.

The disclosure in Japanese Patent Application No. 11-191877 of Jul. 6, 1999 is incorporated here by reference. This Japanese Patent Application describes the invention described hereinabove and claimed in the claims appended hereinbelow and provides the basis for a claim of priority for the instant invention under 35 U.S.C. 119.

What is claimed is:

1. A liquid thermosetting insulating resin composition for filling a via hole and/or a through hole in a printed circuit board, comprising:
   (A) an epoxy resin assuming a liquid state at room temperature,
   (B) a phenolic resin assuming a liquid state at room temperature,
   (C) a curing catalyst, and
   (D) a filler,
   wherein said filler (D) contains a spherical filler and a ground filler, said spherical filler having an average particle diameter of not less than 0.1 μm and less than 25 μm and said ground filler having an average particle diameter of not more than 25 μm.

2. The composition according to claim 1, wherein said spherical filler includes a spherical fine filler and a spherical coarse filler.

3. The composition according to claim 2, wherein said spherical fine filler has an average particle diameter of not less than 0.1 μm and less than 3 μm, said spherical coarse filler has an average particle diameter of not less than 3 μm and less than 25 μm, and said ground filler has an average particle diameter of not more than 25 μm.

4. The composition according to claim 1, wherein said filler (D) is at least one kind of extender.

5. The composition according to claim 1, wherein said spherical filler is silica.

6. The composition according to claim 1, wherein said filler (D) is present in a total amount of 40 to 95% by weight, based on the total weight of the composition.

7. The composition according to claim 1, wherein said ground filler is present in an amount of 5 to 20% by weight, based on the total weight of the filler.

8. The composition according to claim 2, wherein the compounding ratio of said spherical fine filler to said spherical coarse filler is 40–10:60–90 by weight.

9. The composition according to claim 1, further comprising a diluting solvent in an amount of not more than 10% by weight, based on the total weight of the composition.

10. The composition according to claim 1, wherein the compounding ratio of said epoxy resin (A) and said phenolic resin (B) is such that the epoxy group of said epoxy resin (A) accounts for a proportion in the range of 0.8 to 3.0 equivalent weights per one equivalent weight of the phenolic hydroxyl group of said phenolic resin (B).

11. The composition according to claim 1, further comprising at least one additive selected from the group consisting of a coloring agent, a thermal polymerization inhibitor, a thickening agent, an anti-foaming agent, a leveling agent, and a coupling agent.

12. A liquid thermosetting insulating resin composition for filling a via hole and/or a through hole in a printed circuit board, comprising:
   (A) an epoxy resin assuming a liquid state at room temperature,
   (C) a curing catalyst, and
   (D) a filler,
   wherein said filler (D) contains a spherical filler and a ground filler, said spherical filler having an average particle diameter of not less than 0.1 μm and less than 25 μm and said ground filler having an average particle diameter of not more than 25 μm.

13. The composition according to claim 12, wherein said epoxy resin (A) includes at least two kinds of epoxy resins having different activity.

14. The composition according to claim 12, wherein said spherical filler includes a spherical fine filler and a spherical coarse filler.

15. The composition according to claim 14, wherein said spherical fine filler has an average particle diameter of not less than 0.1 μm and less than 3 μm, said spherical coarse filler has an average particle diameter of not less than 3 μm and less than 25 μm, and said ground filler has an average particle diameter of not more than 25 μm.

16. The composition according to claim 12, wherein said filler (D) is at least one kind of extender.

17. The composition according to claim 12, wherein said spherical filler is silica.

18. The composition according to claim 12, wherein said filler (D) is present in a total amount of 40 to 95% by weight, based on the total weight of the composition.

19. The composition according to claim 12, wherein said ground filler is present in an amount of 5 to 20% by weight, based on the total weight of the filler.

20. The composition according to claim 14, wherein the compounding ratio of said spherical fine filler to said spherical coarse filler is 40–10:60–90 by weight.

21. The composition according to claim 12, further comprising a diluting solvent in an amount of not more than 10% by weight, based on the total weight of the composition.

22. The composition according to claim 12, further comprising at least one additive selected from the group consisting of a coloring agent, a thermal polymerization inhibitor, a thickening agent, an anti-foaming agent, a leveling agent, and a coupling agent.

23. A method for permanently filling a hole in a printed circuit board, comprising the steps of:
   filling the hole in said printed circuit board with a liquid thermosetting insulating resin composition set forth in claim 1 or 12,
   heating the composition filled in said hole for precuring the composition,
   removing by polishing a part of the precured composition protruding from a surface defining said hole, and
   further heating the precured composition to cause final curing thereof.

24. The method according to claim 23, wherein said precuring step is carried out at a temperature in the approximate range of 90° to 130° C. for a period in the approximate range of 30 to 90 minutes and said final curing step is carried out at a temperature in the approximate range of 140° to 180° C. for a period in the approximate range of 30 to 90 minutes.

* * * * *